United States Patent
Shin (10) Patent No.: US 7,300,835 B2
(45) Date of Patent: Nov. 27, 2007

(54) MANUFACTURING METHOD OF SEMICONDUCTOR DEVICE

(75) Inventor: Yong-Wook Shin, Gwangju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 158 days.

(21) Appl. No.: 11/315,013

(22) Filed: Dec. 23, 2005

(65) Prior Publication Data

US 2006/0141704 A1    Jun. 29, 2006

(30) Foreign Application Priority Data

Dec. 23, 2004    (KR) .................. 10-2004-0111469

(51) Int. Cl.
*H01L 21/8238* (2006.01)
(52) U.S. Cl. ................................... 438/199
(58) Field of Classification Search ............ 438/201, 438/211, 257, 199, 241
See application file for complete search history.

(56) References Cited

U.S. PATENT DOCUMENTS 4,114,255 A * 9/1978 Salsbury et al. ............ 438/257
5,246,874 A * 9/1993 Bergemont ................. 438/257
5,496,754 A * 3/1996 Bergemont et al. ......... 438/453

\* cited by examiner

*Primary Examiner*—Matthew Smith
*Assistant Examiner*—Ankush Singal
(74) *Attorney, Agent, or Firm*—Lowe Hauptman Ham & Berner LLP (57) ABSTRACT

A method of manufacturing a semiconductor device including forming a gate oxide layer, a first conductive layer, a capacitor dielectric layer, and a second conductive layer on a semiconductor substrate. The method also includes patterning the first and second conductive layers, the gate oxide layer, and the field oxide layer so as to form a gate pattern and a capacitor pattern; selectively wet-etching the first and second conductive layer so as to project out an outward part of the capacitor dielectric layer; implanting ions into the semiconductor substrate using the gate pattern and the protruding portion of the capacitor dielectric layer as an implantation mask; and removing the protruding portion of the capacitor dielectric layer so that the patterned capacitor dielectric layer has the same width as the gate electrode and the first capacitor electrode.

9 Claims, 9 Drawing Sheets

MANUFACTURING METHOD OF SEMICONDUCTOR DEVICE

CROSS-REFERENCE TO RELATED APPLICATION

This application claims priority to and the benefit of Korean Patent Application No. 10-2004-0111469 filed in the Korean Intellectual Property Office on Dec. 23, 2004, the entire contents of which are incorporated herein by reference.

BACKGROUND OF THE INVENTION (a) Field of the Invention

The present invention relates to a method of manufacturing a semiconductor device. More particularly, the present invention relates to a method of manufacturing a semiconductor device for forming a source/drain region of an analog CMOS.

(b) Description of the Related Art

Generally, transistors of semiconductor devices may be classified into an NMOS, a PMOS, and a CMOS according to their channel type. An NMOS is formed with an N-channel, and a PMOS with a P-channel. In addition, the CMOS (complementary metal oxide silicon) has the NMOS and the PMOS, and thus both an N-channel and a P-channel are formed therein.

A conventional CMOS manufacturing method will hereinafter be described in detail with reference to FIG. 1A to FIG. 1D.

FIG. 1A to FIG. 1D are cross-sectional views showing principal manufacturing stages of a conventional semiconductor device.

Figure 1A:
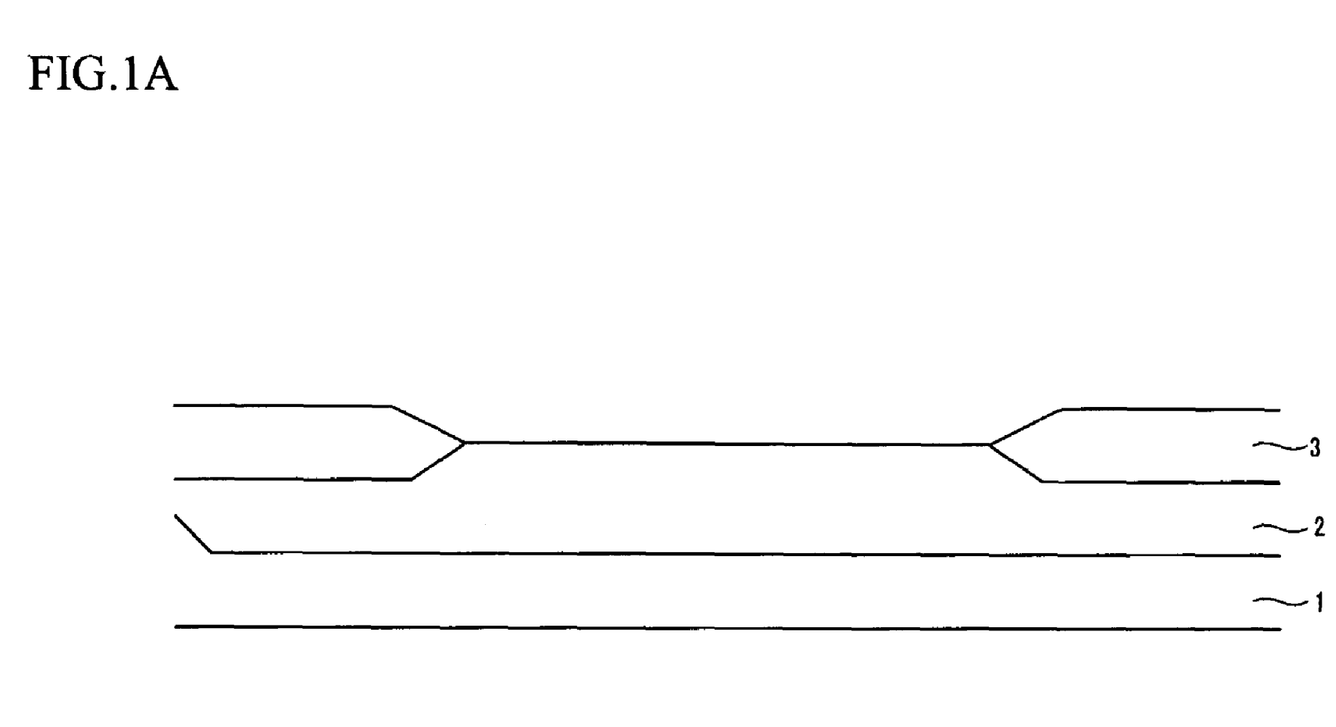
FIG. 1A to FIG. 1D are cross-sectional views showing principal manufacturing stages of a conventional semiconductor device.

As shown in FIG. 1A, a well 2 is formed on a semiconductor substrate 1 by implanting ions, and a field oxide layer 3 is formed thereon. The well 2 is classified as a p-well or an n-well according to the type of ions implanted into the semiconductor substrate 1. The p-well is formed on a semiconductor substrate for forming an NMOS, and the n-well is for forming a PMOS.

Figure 1B:
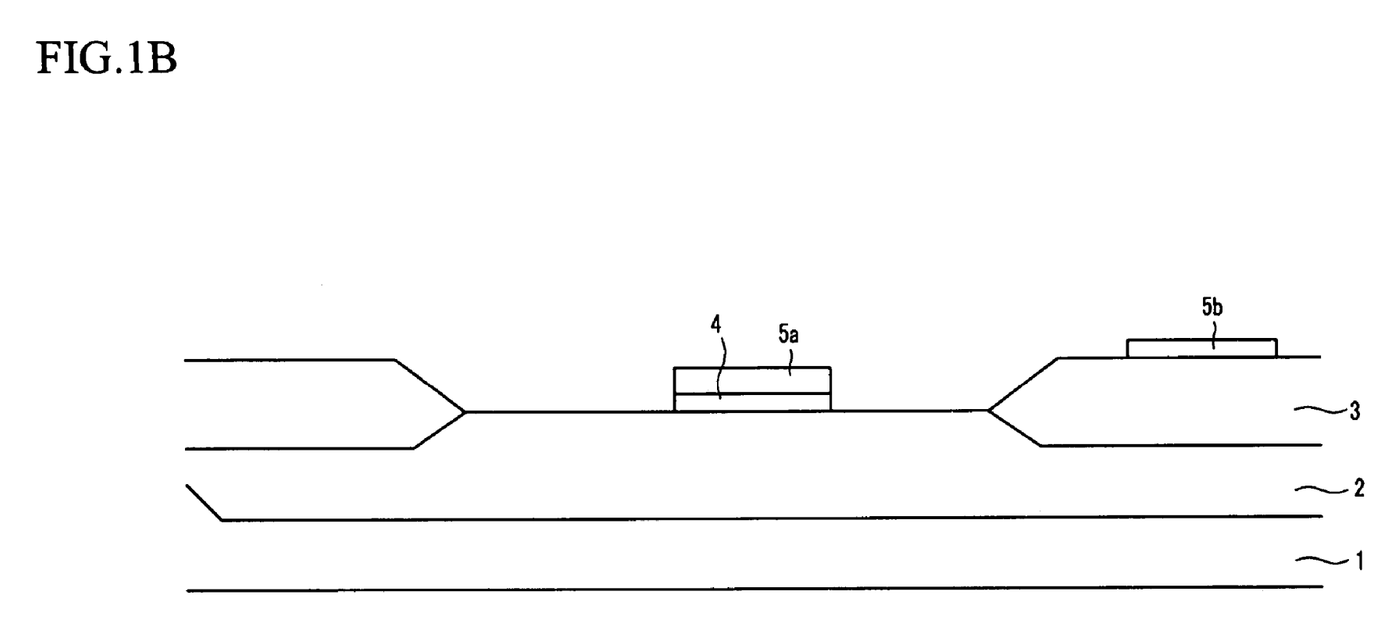

Then, as shown in FIG. 1B, a gate oxide layer 4 is formed on the semiconductor substrate 1. Subsequently, a conductive layer such as a polysilicon layer is formed on the field oxide layer 3 and gate oxide layer 4, and it is patterned by a photolithography and etching process so as to form a first capacitor electrode 5b and a gate electrode 5a of an analog CMOS.

Figure 1C:
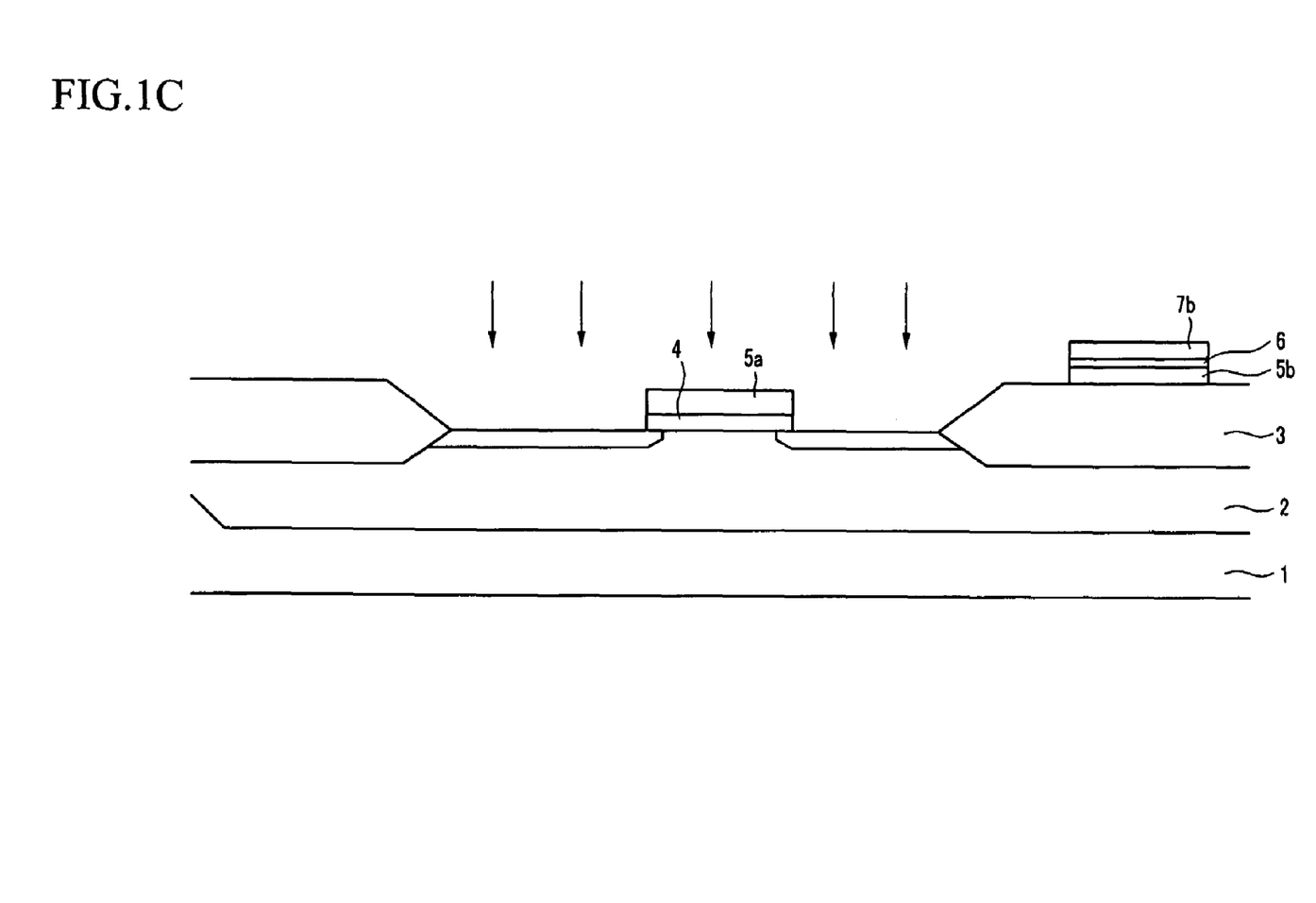

As shown in FIG. 1C, a capacitor dielectric layer 6 such as an oxide-nitride-oxide (ONO) layer is formed on the first capacitor electrode 5b, and a second capacitor electrode 7b is formed thereon so as to form a capacitor stack. Subsequently, impurity ions are implanted at a low concentration into the semiconductor substrate 1 using the gate electrode 5a as an implantation mask.

Figure 1D:
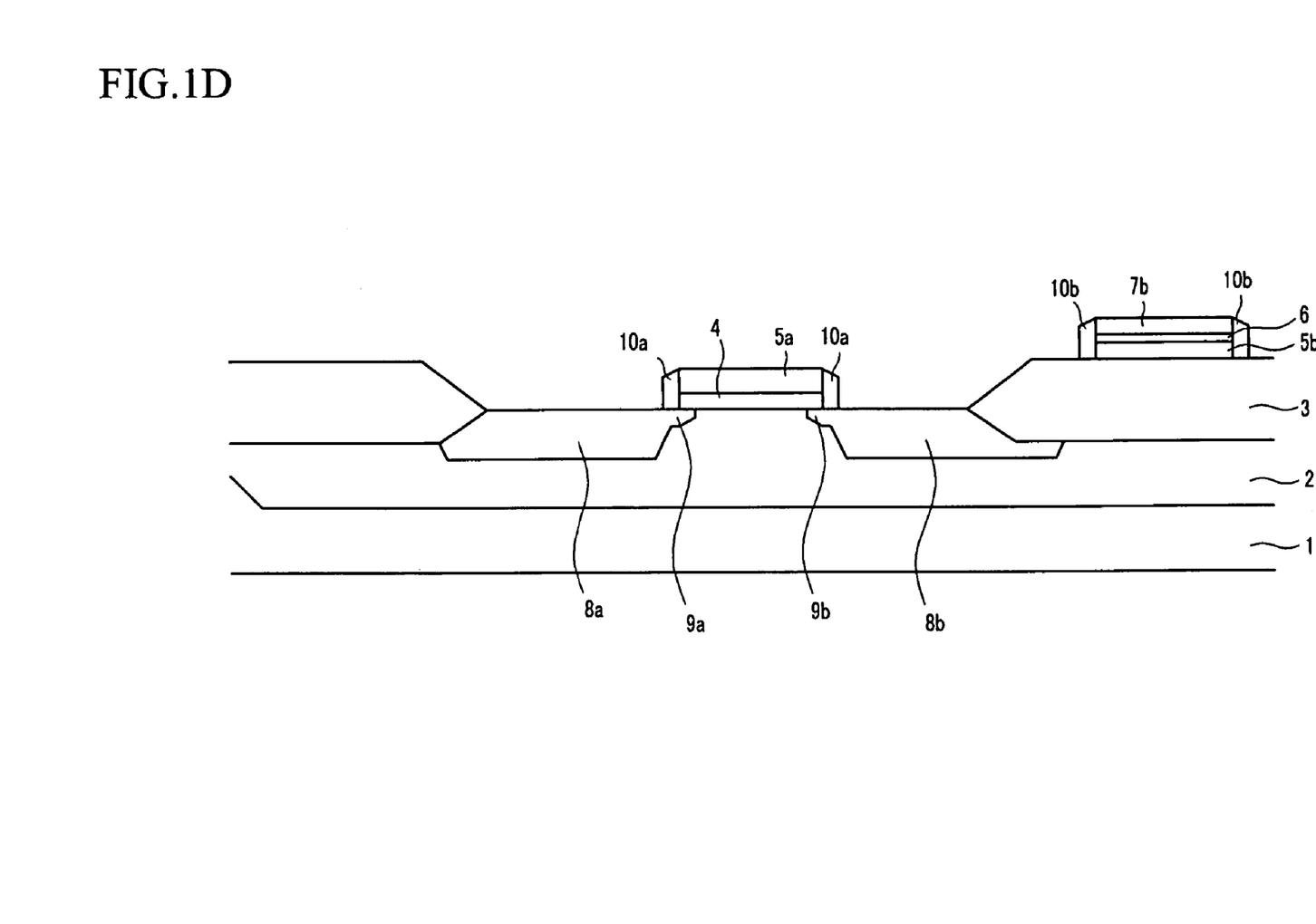

Then, as shown in FIG. 1D, spacer layers 10a and 10b are respectively formed on sidewalls of the gate electrode 5a and sidewalls of the capacitor stack. Subsequently, impurity ions are implanted at high concentrations into the semiconductor substrate 1 using the gate electrode 5a and the insulation layer spacer 10a as an implantation mask. Then, a source region 8a, a drain region 8b, and lightly doped drain (LDD) regions 9a and 9b are formed. The lightly doped drain regions 9a and 9b are located between the source/drain regions 8a, 8b and a channel region, and are used for suppressing device degradation such as a hot carrier effect.

As described above, in order to form the conventional lightly doped drain regions 9a/9b and the source/drain regions 8a/8b, the ion implantation process for forming a source/drain should be performed at least twice.

The above information described in this Background section is only for enhancement of understanding of the background of the invention and therefore it may contain information that is not prior art to the present invention.

SUMMARY OF THE INVENTION

The present invention has been made in an effort to provide a method of manufacturing a semiconductor device having advantages of simplifying a manufacturing process of a semiconductor device.

An exemplary method of manufacturing a semiconductor device according to an embodiment of the present invention includes forming wells in a semiconductor substrate by implanting ions thereinto; forming a field oxide layer on the semiconductor substrate; forming a gate oxide layer on the semiconductor substrate; forming a first conductive layer on the gate oxide layer and the field oxide layer; forming a capacitor dielectric layer on the first conductive layer; forming a second conductive layer on the capacitor dielectric layer; patterning the first and second conductive layers, the gate oxide layer, and the capacitor dielectric layer so as to form a gate pattern and a capacitor pattern; selectively wet-etching the first and second conductive layers such that the capacitor dielectric layer becomes outwardly protrudent; implanting ions into the semiconductor substrate using the gate pattern and the protruding portion of the capacitor dielectric layer as an implantation mask; removing the protruding portion of the capacitor dielectric layer so that the patterned capacitor dielectric layer has the same width as the gate electrode and the first capacitor electrode, respectively; and selectively removing the capacitor dielectric layer on the gate electrode and the second conductive layer on the gate electrode.

In a further embodiment, an etchant solution having a higher etch rate for the first and second conductive layers than for the capacitor dielectric layer can be used for the wet-etching of the first and second conductive layer.

The protrudent portion of the capacitor dielectric layer can be removed by a cleaning process including megasonic cleaning.

The capacitor dielectric layer can be formed by sequentially depositing an oxide layer, a nitride layer, and another oxide layer.

The capacitor dielectric layer can be formed to a thickness of 150-200 Å.

A gate electrode, a bottom electrode, and a top electrode of the capacitor can be formed in the step of wet-etching the first and the second conductive layer.

A lightly doped drain region and a source/drain region can be formed in the step of implanting ions into the semiconductor substrate using the gate pattern and the protruding portion of the capacitor dielectric layer as an implantation mask.

The depth of the lightly doped drain region can depend on the thickness of the capacitor dielectric layer.

The first conductive layer and the second conductive layer can be formed as polysilicon layers, respectively.

DETAILED DESCRIPTION OF THE EMBODIMENTS

An exemplary embodiment of the present invention will hereinafter be described in detail with reference to the accompanying drawings.

FIG. 2A to FIG. 2E are cross-sectional views showing principal manufacturing stages of an exemplary semiconductor device according to an embodiment of the present invention.

Figure 2A:
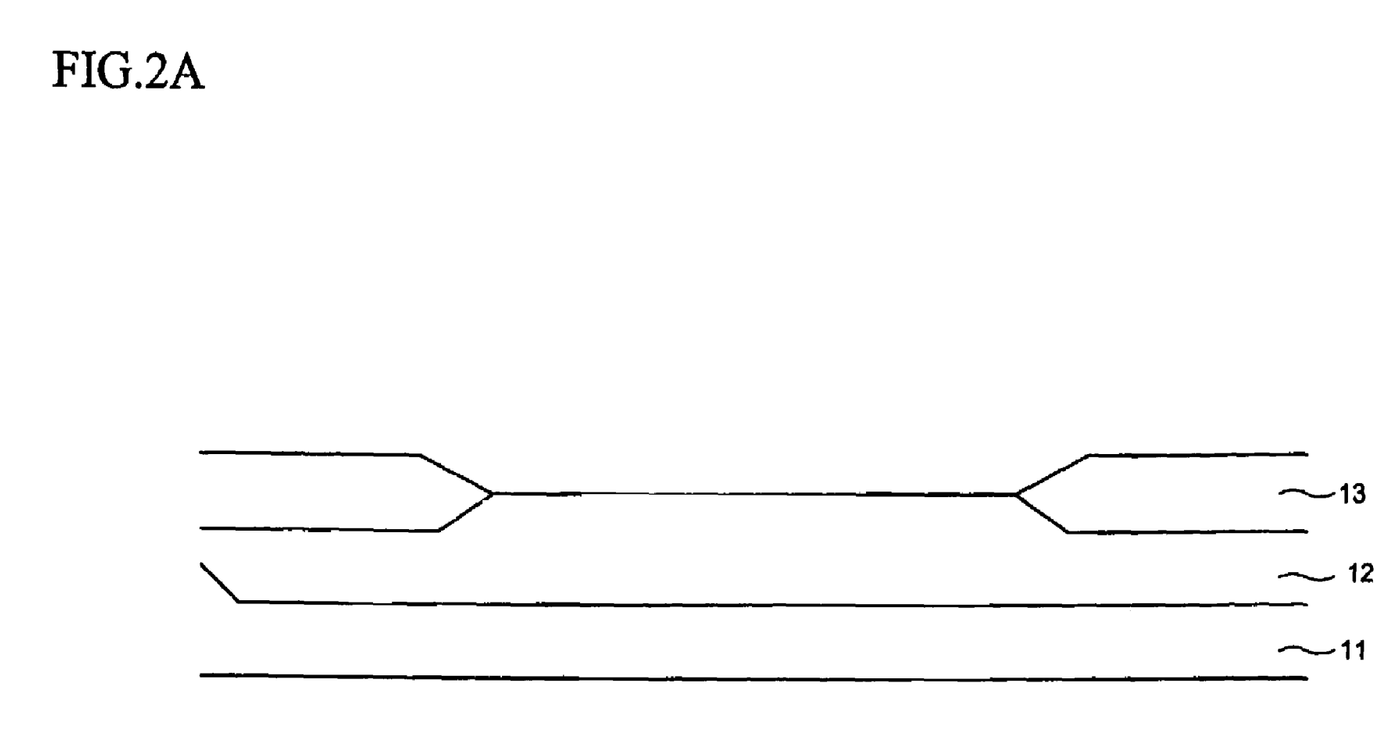
FIG. 2A to FIG. 2E are cross-sectional views showing principal manufacturing stages of an exemplary semiconductor device according to an embodiment of the present invention.

First, as shown in FIG. 2A, wells 12 are formed on a semiconductor substrate 11 by implanting ions thereinto, and a field oxide layer 13 is formed thereon. At this time, the wells 12 are classified into a p-well and an n-well according to the type of ions implanted into the semiconductor substrate 11. The p-well is formed on a semiconductor substrate for forming an NMOS, and the n-well is for forming a PMOS.

Figure 2B:
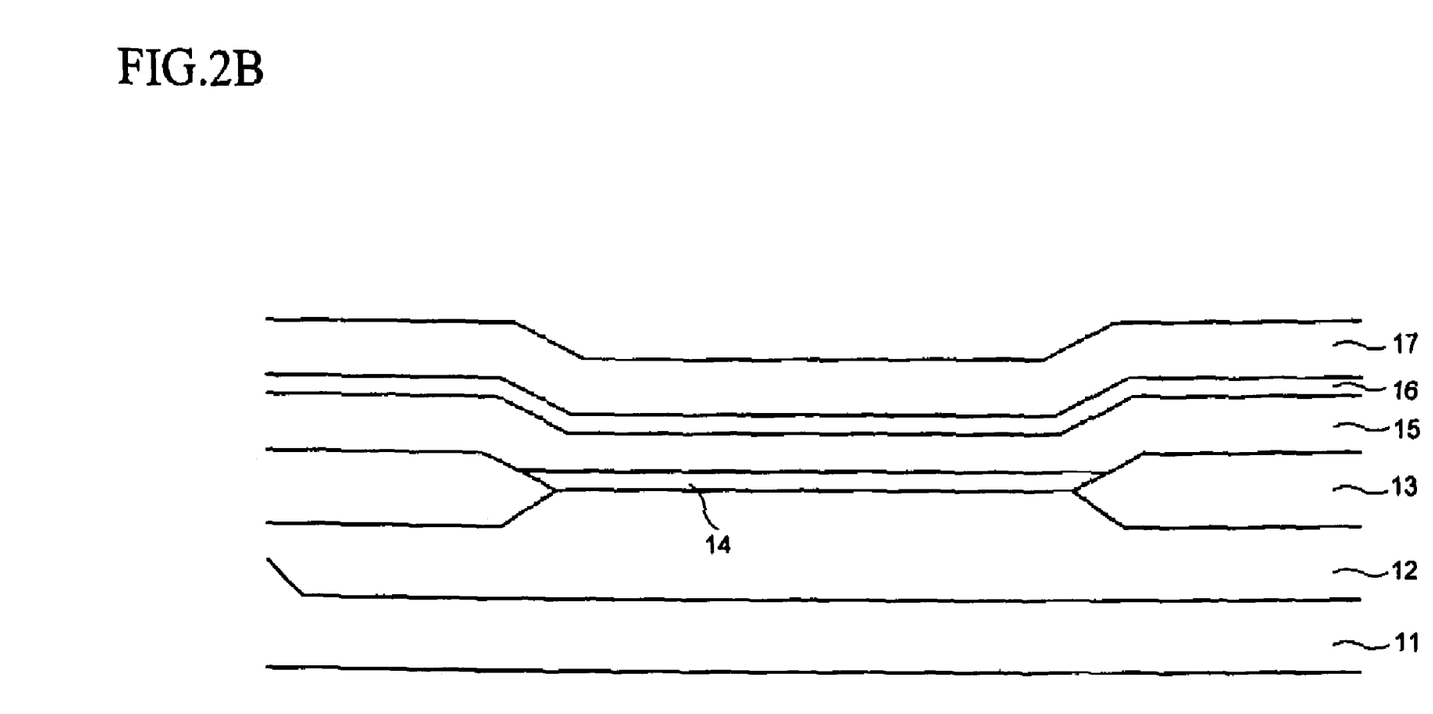

Then, as shown in FIG. 2B, a gate oxide layer 14 is formed on the semiconductor substrate 11. Subsequently, a first conductive layer 15 such as a polysilicon layer is formed on the field oxide layer 13 and the gate oxide layer 14. A capacitor dielectric layer 16 such as an oxide-nitride-oxide (ONO) layer is formed on the first conductive layer 15, and a second conductive layer 17 is formed thereon. At this time, the ONO layer 16 can be formed by sequentially depositing an oxide layer, a nitride layer, and another oxide layer.

Figure 2C:
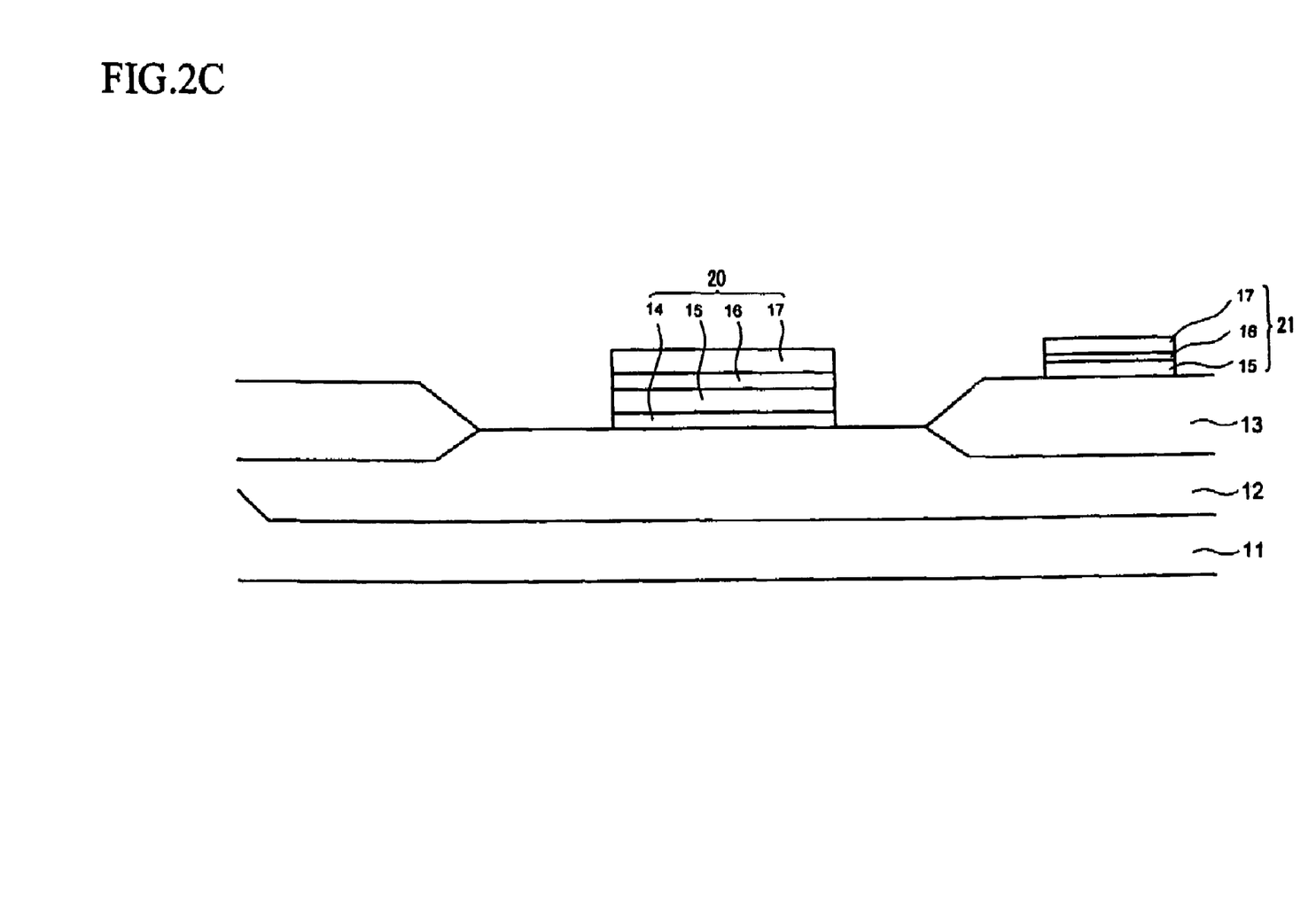

Next, as shown in FIG. 2C, the gate oxide layer 14, the first and second conductive layers 15 and 17, and the capacitor dielectric layer 16 are patterned by a photolithography and etching process so as to form a gate pattern 20 and a capacitor pattern 21 on the semiconductor substrate 11 and the field oxide layer 13.

Figure 2D:
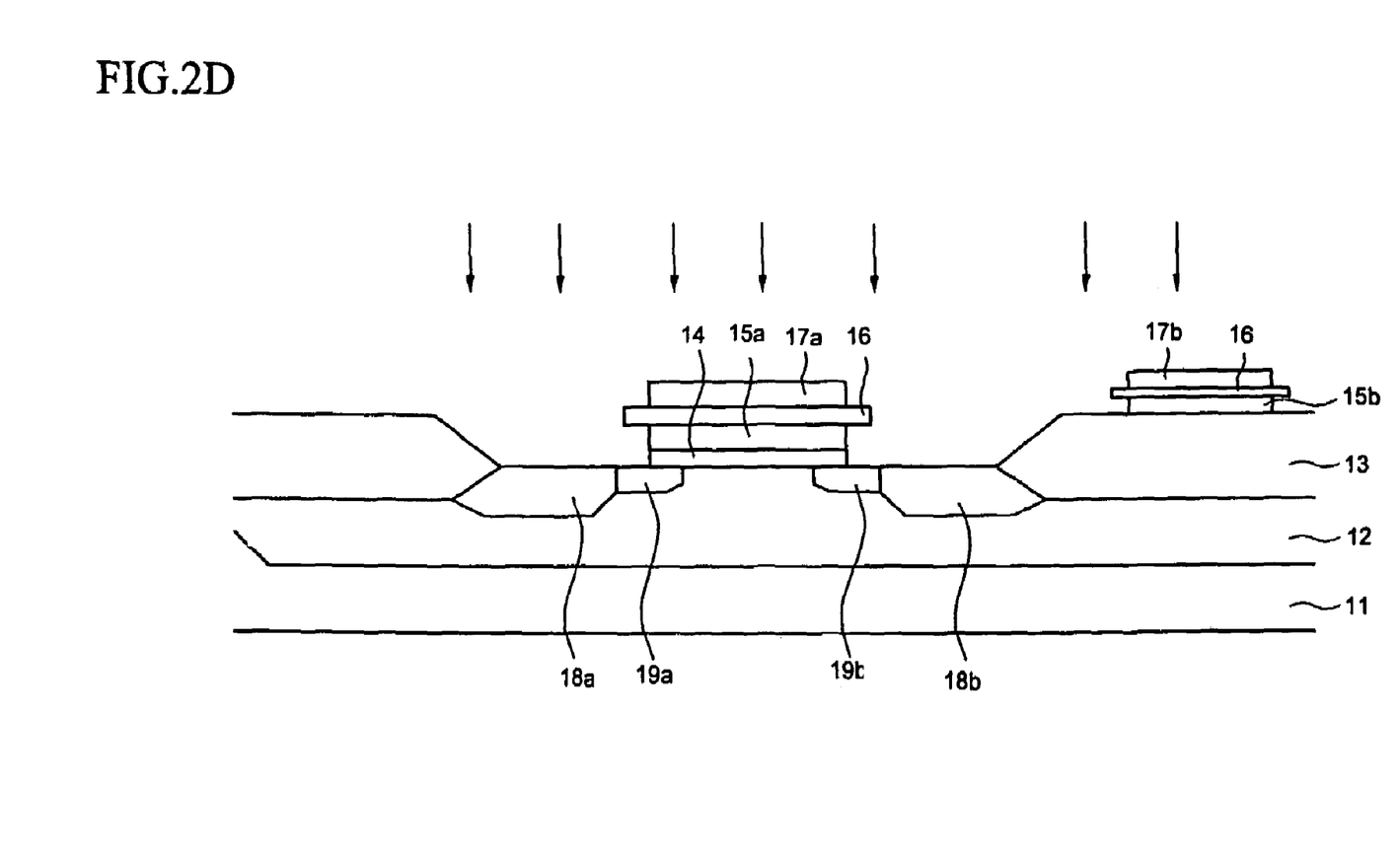

As shown in FIG. 2D, the gate pattern 20 and the capacitor pattern 21 are selectively wet-etched such that the capacitor dielectric layer 16 becomes laterally protrudent.

The capacitor dielectric layer 16 can become protrudent by using an etchant solution having a higher etch rate for the first and second conductive layers 15 and 17 than that for the capacitor dielectric layer 16.

Here, a gate electrode 15a and a first capacitor electrode 15b are formed by etching the first conductive layer 15, and a dummy gate electrode 17a and a second capacitor electrode 17b are formed by etching the second conductive layer 17.

Impurity ions are implanted at high concentrations into the semiconductor substrate 11 using the gate pattern and the protrudent portion of the capacitor dielectric layer 16 as an implantation mask. Then, source/drain regions 18a and 18b and lightly doped drain regions 19a and 19b are simultaneously formed.

In this structure, a channel region is formed under the gate electrode 15a, and lightly doped drain regions 19a and 19b are formed under the protrudent portion of the capacitor dielectric layer 16. The lightly doped drain regions 19a and 19b having a shallow depth are located between the source/drain regions 18a and 18b and a channel region, and are used for suppressing device degradation such as a hot carrier effect.

The depth of the lightly doped drain regions 19a and 19b can depend on the thickness of the capacitor dielectric layer 16. The capacitor dielectric layer 16 can be formed to a thickness of 150-200 Å.

In addition, source and drain regions 18a and 18b having a high impurity concentration are formed at a certain part of the semiconductor substrate 11 except at the region under the capacitor dielectric layer 16.

Figure 2E:
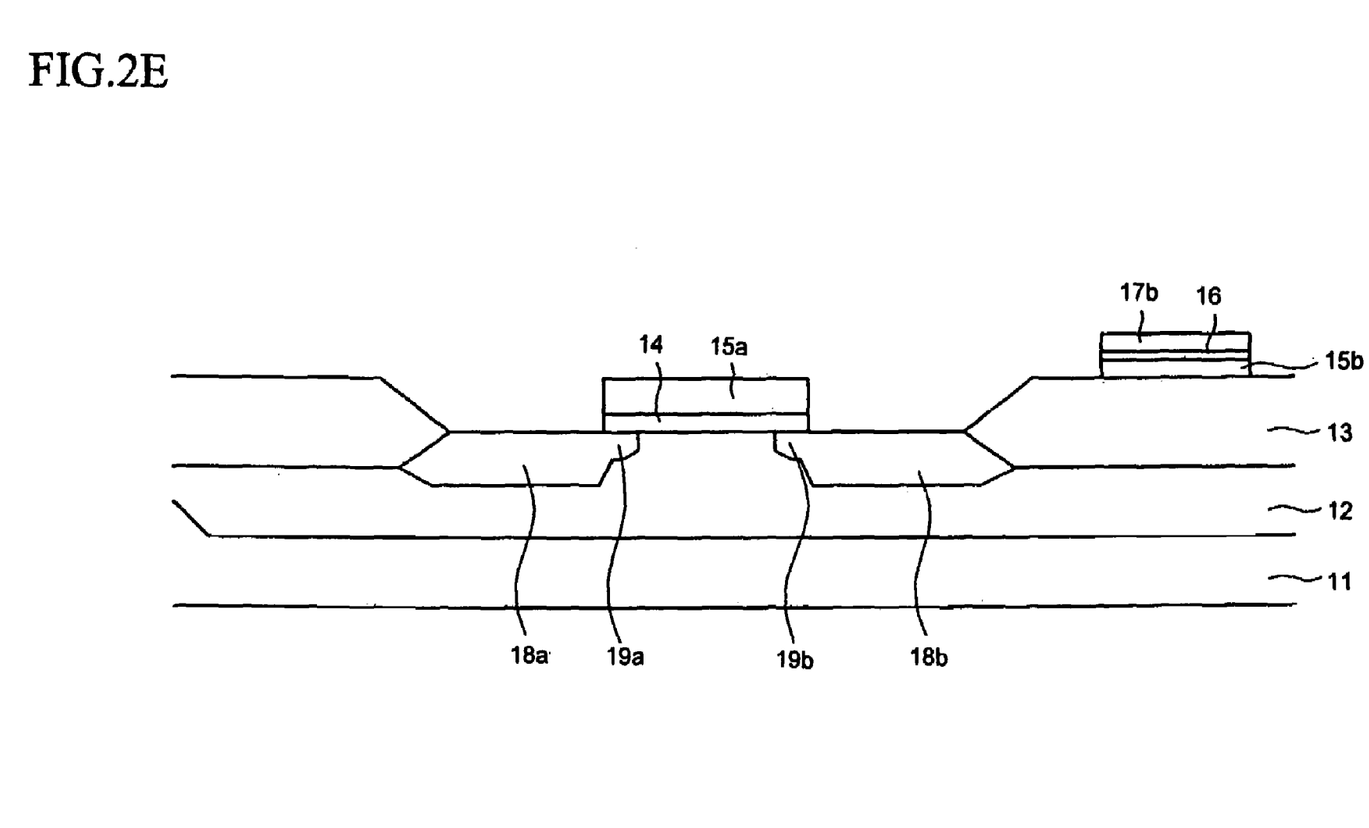

Subsequently, as shown in FIG. 2E, the protruding portion of the capacitor dielectric layer 16 is removed by a cleaning process including megasonic cleaning so that the patterned capacitor dielectric layer 16 has the same width as the gate electrode and the first capacitor electrode, respectively. Then, the capacitor dielectric layer 16 on the gate electrode 15a and the second conductive layer 17a on the gate electrode 15a are selectively removed.

According to the present invention, a source/drain region and a lightly doped drain region can be simultaneously formed by an ion implantation process using the capacitor dielectric layer as an implantation mask. Consequently, process steps for forming an LDD structure can be reduced, and therefore a yield of semiconductor devices can be increased, and the cost for producing semiconductor devices can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, comprising:

forming wells in a semiconductor substrate by implanting ions thereinto;

forming a field oxide layer on the semiconductor substrate;

forming a gate oxide layer on the semiconductor substrate;

forming a first conductive layer on the gate oxide layer and the field oxide layer;

forming a capacitor dielectric layer on the first conductive layer;

forming a second conductive layer on the capacitor dielectric layer;

patterning the first and second conductive layers, the gate oxide layer, and the capacitor dielectric layer so as to form a gate pattern and a capacitor pattern;

selectively wet-etching the first and second conductive layers such that the capacitor dielectric layer becomes outwardly protrudent at a protruding portion thereof;

implanting ions into the semiconductor substrate using the gate pattern and the protruding portion of the capacitor dielectric layer as an implantation mask;

removing the protruding portion of the capacitor dielectric layer so that the patterned capacitor dielectric layer has the same width as a gate electrode and a first capacitor electrode, respectively; and selectively removing the capacitor dielectric layer on the gate electrode and the second conductive layer on the gate electrode.

2. The method of claim 1, wherein an etchant solution having a higher etch rate for the first and second conductive layers than that for the capacitor dielectric layer is used for the wet-etching of the first and second conductive layers.

3. The method of claim 1, wherein the protruding portion of the capacitor dielectric layer is removed by a cleaning process including megasonic cleaning.

4. The method of claim 1, wherein the capacitor dielectric layer is formed by sequentially depositing an oxide layer, a nitride layer, and another oxide layer.

5. The method of claim 4, wherein the capacitor dielectric layer is formed to a thickness of 150-200 Å.

6. The method of claim 1, wherein the gate electrode, a bottom electrode, and a top electrode of the capacitor are formed in the step of wet-etching the first and the second conductive layer.

7. The method of claim 6, wherein a lightly doped drain region and a source/drain region are formed in the step of implanting ions into the semiconductor substrate using the gate pattern and the protruding portion of the capacitor dielectric layer as an implantation mask.

8. The method of claim 7, wherein the depth of the lightly doped drain region depends on the thickness of the capacitor dielectric layer.

9. The method of claim 1, wherein the first conductive layer and the second conductive layer are formed as polysilicon layers, respectively.

* * * * *